(12) United States Patent
Yen et al.

(10) Patent No.: US 6,972,703 B1
(45) Date of Patent: Dec. 6, 2005

(54) VOLTAGE DETECTION CIRCUIT

(75) Inventors: Wen-Cheng Yen, Hsinchu (TW); Chao-Chi Lee, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/014,268

(22) Filed: Dec. 16, 2004

(51) Int. Cl.[7] .............................................. H03M 1/00
(52) U.S. Cl. ........................ 341/136; 327/143; 327/530
(58) Field of Search ........................... 341/136; 327/77, 327/143, 72, 74, 530, 513, 65, 68

(56) References Cited

U.S. PATENT DOCUMENTS

| | | | |
|---|---|---|---|
| 5,814,995 A | * | 9/1998 | Tasdighi ..................... 324/431 |
| 6,169,426 B1 | * | 1/2001 | Lee et al. ..................... 327/77 |
| 6,445,218 B1 | * | 9/2002 | Lee ............................. 327/65 |

* cited by examiner

Primary Examiner—John B Nguyen
(74) Attorney, Agent, or Firm—Winston Hsu

(57) ABSTRACT

A voltage detection circuit. A second NMOS transistor has a gate coupled to the gate of a first NMOS transistor. A comparator has input terminals, and an output terminal. A first resistor is coupled between the first input terminal and the source of the first NMOS transistor, a second resistor is coupled to the comparator and the first resistor, a third resistor is coupled between the second resistor and the comparator, and a fourth resistor is coupled between the second and third resistors, and ground. A first PMOS transistor has a gate coupled to the gates of the first and second NMOS transistors. A second PMOS transistor has a connected gate and drain, a source coupled to the gates of first and second NMOS transistors, a drain coupled to ground, and an n-well directly connected to the gates of the first and second NMOS transistors.

13 Claims, 5 Drawing Sheets

VOLTAGE DETECTION CIRCUIT

BACKGROUND

The present disclosure relates in general to a voltage detection circuit. In particular, the present disclosure relates to a voltage detection circuit for power-on detection with temperature compensation.

FIG. 1 shows a circuit diagram of a conventional power-on detection circuit. The power-on detection circuit 100 comprises a voltage detection circuit 110 and a RC-filter 120.

The voltage detection circuit 110 comprises a PMOS transistor MP1, NMOS transistors MN1, MN2, and a resistor R1. The NMOS transistor MN1 and PMOS MP1 transistor comprise a voltage reference circuit. The drain and gate of the PMOS transistor MP1 are both coupled to node A, to which the drain and gate of the NMOS transistor MN1 are coupled. The node A is coupled to the gate of the NMOS transistor MN2. Resistor R1 is coupled between the drain of the NMOS transistor MN2 and the voltage source VCC.

The PMOS transistors MP1 and the NMOS transistor MN1 form a voltage divider to generate a reference voltage at node A. The reference voltage is determined by threshold voltages Vthn1 and Vthp1 of the NMOS transistor MN1 and of the PMOS transistor MP1 respectively. The NMOS transistor MN2 is configured as a common-source with a passive load R1 for outputting the detected result at node B.

At power-on, voltage source VCC is increased from 0V. Thus, the voltage level of node A is lower than the threshold voltage Vthn2 of NMOS transistor MN2. Therefore, NMOS transistor MN2 is turned off, NMOS transistor MN3 is turned on, and output terminal OUT of inverter 130 is low. When voltage source VCC reaches a predetermined value causing the voltage level of node A exceed the threshold voltage Vthn2 of NMOS transistor MN2, NMOS transistor MN2 is turned on and NMOS transistor MN3 is turned off. Thus, output terminal OUT of inverter 130 is at high voltage after a RC delay period.

When the process or temperature induces variations in the threshold voltage Vthn2 of the NMOS transistor MN2, the threshold voltage Vthn1 of the NMOS transistor MN1 varies correspondingly. Thus, the reference voltage corresponds to the threshold voltage Vthn1 of the NMOS transistor MN1. When the voltage VCC remains the same, the variation of the reference voltage compensates for the variation in the threshold voltage Vthn2 of the NMOS transistor MN2. Therefore, the voltage of node B remains constant without suffering from the variation of the threshold voltage Vthn.

However, the voltage detection of the power-on detection circuit 100 is imprecise when the voltage source VCC is scaled down by the advance process. As the variation of threshold voltages Vthn1, Vthn2 and Vthp1 are not scaled down with process, variations of the detected voltage are very large and voltage overhead may result.

FIG. 2 shows another conventional power-on detection circuit. The power-on detection circuit comprises a voltage detection circuit 20 and a RC-filter 22. The gate of NMOS transistor M11 is connected to its drain. The gate of NMOS transistor M12 is connected to its drain at node E. The sources of NMOS transistors M11 and M12 are connected to ground. In addition, the aspect ratio of the NMOS transistor MN11 is m times larger than that of the NMOS transistor MN12. Thus, m numbers of NMOS transistors connected in parallel comprise the NMOS transistor MN11.

Comparator 201 comprises a first input terminal connected to node D, a second input terminal connected to node E, and output terminal VOUT. The voltage level of node D is voltage VA, and that of node E is voltage VB. Comparator 201 outputs low voltage when voltage VA is lower than voltage VB, and outputs high voltage when voltage VA exceeds voltage VB.

Resistor R0 is connected between node D and the gate and drain of the NMOS transistor M11. Resistor R13 is connected to the power source VCC. Resistor R11 is connected between node D and resistor R13. Resistor R12 is connected between node E and resistor R13.

During the power-on process, the voltage source VCC is initially increased from 0V, before reaching a predetermined voltage level $V_{rr}$, voltage VA is lower than the voltage VB, and the output terminal VOUT of the comparator 201 is at low level. Until the voltage source VCC rises to the predetermined voltage level $V_{rr}$, the output terminal VOUT of the comparator 201 is at high level margin.

When the voltage source VCC reaches the predetermined voltage level $V_{rr}$, the voltage VA is equal to voltage VB. At this time, comparator 201 detects the voltage VA and VB, and its output terminal VOUT transitions from low level to high level. Subsequently, the voltage VA exceeds the voltage VB. Thus, the output terminal VOUT of the comparator 201 is at the high level margin. Thus, NMOS transistor M13 is turned on by the comparator 201, and output terminal OUT is at a high voltage after a RC delay period.

Equation (1) describes the drain current $I_D$ of a MOS transistor with operating in subthreshold region.

$$I_D = \mu_n C_d \frac{W}{L} V_T^2 \left(\exp\frac{V_{GS} - V_{TH}}{\zeta V_T}\right) \cdot \left(1 - \exp\frac{-V_{DS}}{V_T}\right) \cong \quad (1)$$

$$\mu_n C_d \frac{W}{L} V_T^2 \left(\exp\frac{V_{GS} - V_{TH}}{\zeta V_T}\right) = A\mu_n V_T^2 \left(\exp\frac{V_{GS} - V_{TH}}{\zeta V_T}\right)$$

where $$V_T \equiv \frac{KT}{q}; \zeta \equiv 1 + \frac{C_d}{C_{OX}}; A = C_d \frac{W}{L}$$

Let $V_{GS} - V_{TH} = V_{OV}$, thus:

$$V_{OV} = \zeta V_T [\ln(I_D) - \ln(A\mu_n V_T^2)] \quad (2)$$

According equation (2), $V_{GS1}$ and $V_{GS2}$ respectively of NMOS transistors M11 and M12 are:

$$V_{GS1} = V_{OV1} + V_{TH} = \zeta V_T [\ln(I_{D1}) - \ln(A\mu_n V_T^2)] + V_{TH} \quad (3)$$

$$V_{GS2} = V_{OV2} + V_{TH} = \zeta V_T \left[\ln\left(I_{D1} \cdot m \cdot \frac{R11}{R12}\right) - \ln(A\mu_n V_T^2)\right] + V_{TH} \quad (4)$$

As mentioned, the voltage VA is equal to voltage VB when the voltage source VCC reaches the predetermined voltage level $V_{rr}$. Thus, the voltage difference $\Delta V_{OV}$ across resistor R0 is:

$$V_{GS2} - V_{GS1} = V_{OV2} - V_{OV1} = \Delta V_{OV} = \zeta V_T \ln\left(m \cdot \frac{R11}{R12}\right) \quad (5)$$

Thus, the voltage difference $\Delta V_{OV}$ is increased incrementally as temperature increases. In addition, NMOS transistors M11 and M12 are biased in the sub-threshold region, such that the threshold voltage VTH NMOS transistors M11 and M12 are decreased incrementally as temperature increases, which are the voltage differences between the drain and the source of the NMOS transistors M11 and that of NMOS transistors M12 respectively.

When the voltage VCC remains at $V_{rr}$ and the variation of temperature, the variation of voltage difference $\Delta V_{OV}$ compensates for the variation of the voltage difference between the drain and the source of the NMOS transistors M11 and M12.

In addition, when the voltage VA is equal to voltage VB, the voltage level $V_{rr}$ is:

$$V_{rr} = V_{OV1} + V_{TH} + \left(\frac{\Delta V_{OV}}{R0}\right)(R11 + R0) + \left(\frac{\Delta V_{OV}}{R0}\right)\left(1 + \frac{R11}{R12}\right)R13 = \quad (6)$$

$$V_{OV1} + V_{TH} + \left(\frac{\Delta V_{OV}}{R0}\right)\left[(R11 + R0) + \left(1 + \frac{R11}{R12}\right)R13\right]$$

According to equations (1) and (5), the voltage difference $\Delta V_{OV}$ and current $I_{D1}$ and $I_{D2}$ are increased incrementally as temperature increases. In addition, $V_{OV1}$ is increased with the increased current $I_{D1}$. Thus, the first term ($V_{OV1}$) and third term of equation (6) have a positive temperature coefficient (PTC), and the second term ($V_{TH}$) of equation (6) has a negative temperature coefficient (NTC) and a fixed factor. Thus, an adjustable voltage level $V_{rr}$ with temperature compensation cannot be obtained.

SUMMARY

Methods and devices for obtaining sampling clocks are provided. Embodiments of a voltage detection circuit for detecting a voltage level of a power source, comprises: a first NMOS transistor comprising a first gate, a first source, and a first drain coupled to the power source; a second NMOS transistor comprising a second gate coupled to the first gate, a second source, and a second drain coupled to the power source; a comparator comprising a first input terminal, a second input terminal coupled to the second source, and an output terminal; a first resistor coupled between the first input terminal and the first source; a second resistor coupled to the first input terminal and the first resistor; a third resistor coupled between the second resistor and the second input terminal; a fourth resistor coupled between a connection point of the second resistor and the third resistor, and ground; a first PMOS transistor comprising a third gate coupled to the first gate and the second gate, a third source coupled to the power source, and a third drain coupled to the third gate; a second PMOS transistor comprising a fourth gate, a fourth source coupled to the first gate and the second gate, a fourth drain coupled to the fourth gate and ground, and a fourth n-well directly connected to the first gate and the second gate.

DESCRIPTION OF THE DRAWINGS

Various aspects of embodiments of the invention will become more fully understood from the detailed description, given hereinbelow, and the accompanying drawings. The drawings and description are provided for purposes of illustration only and, thus, are not intended to be limiting of the present invention.

DETAILED DESCRIPTION

Figure 1:
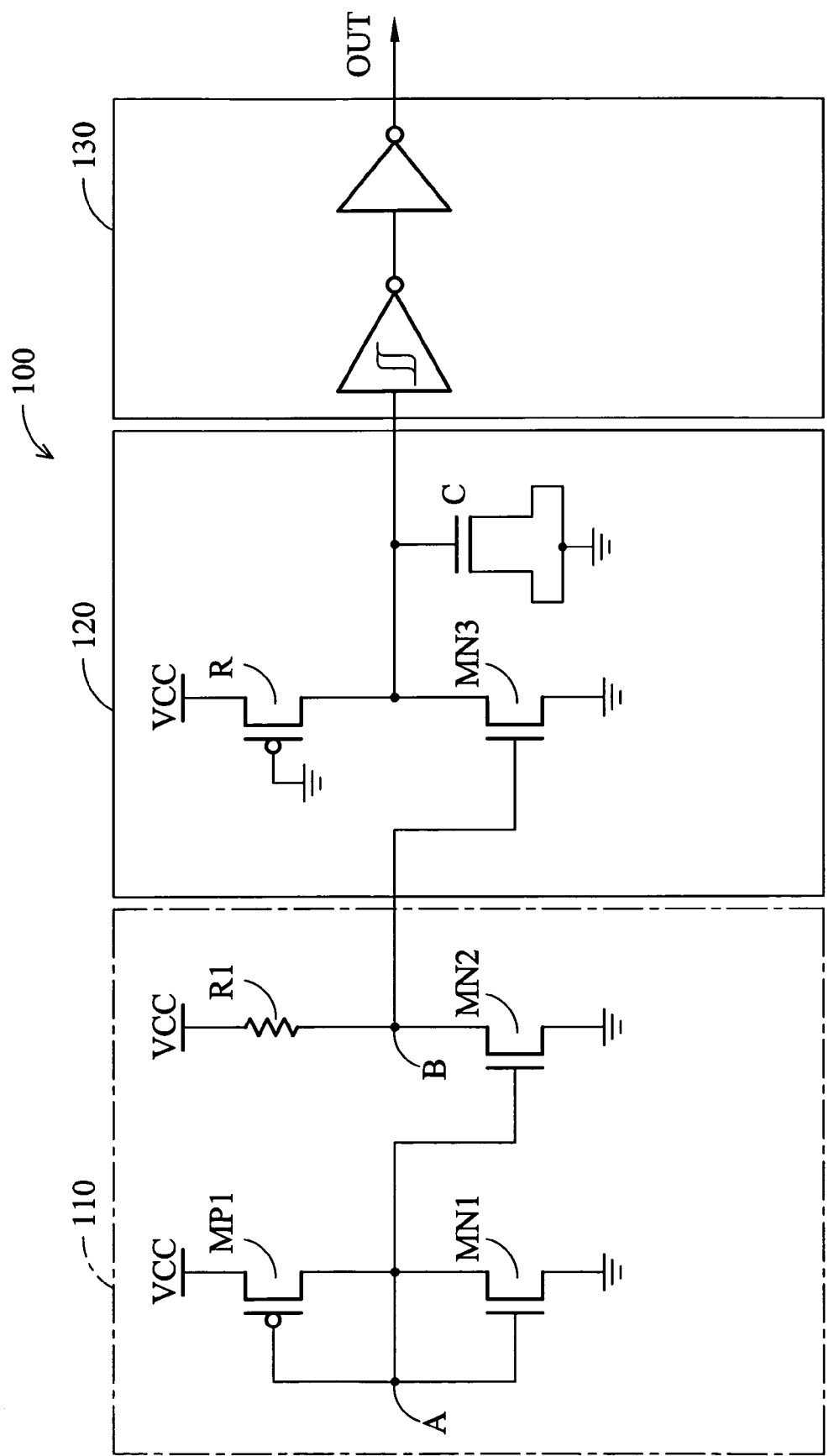
FIG. 1 shows a circuit diagram of a conventional power-on detection circuit.
Figure 2:
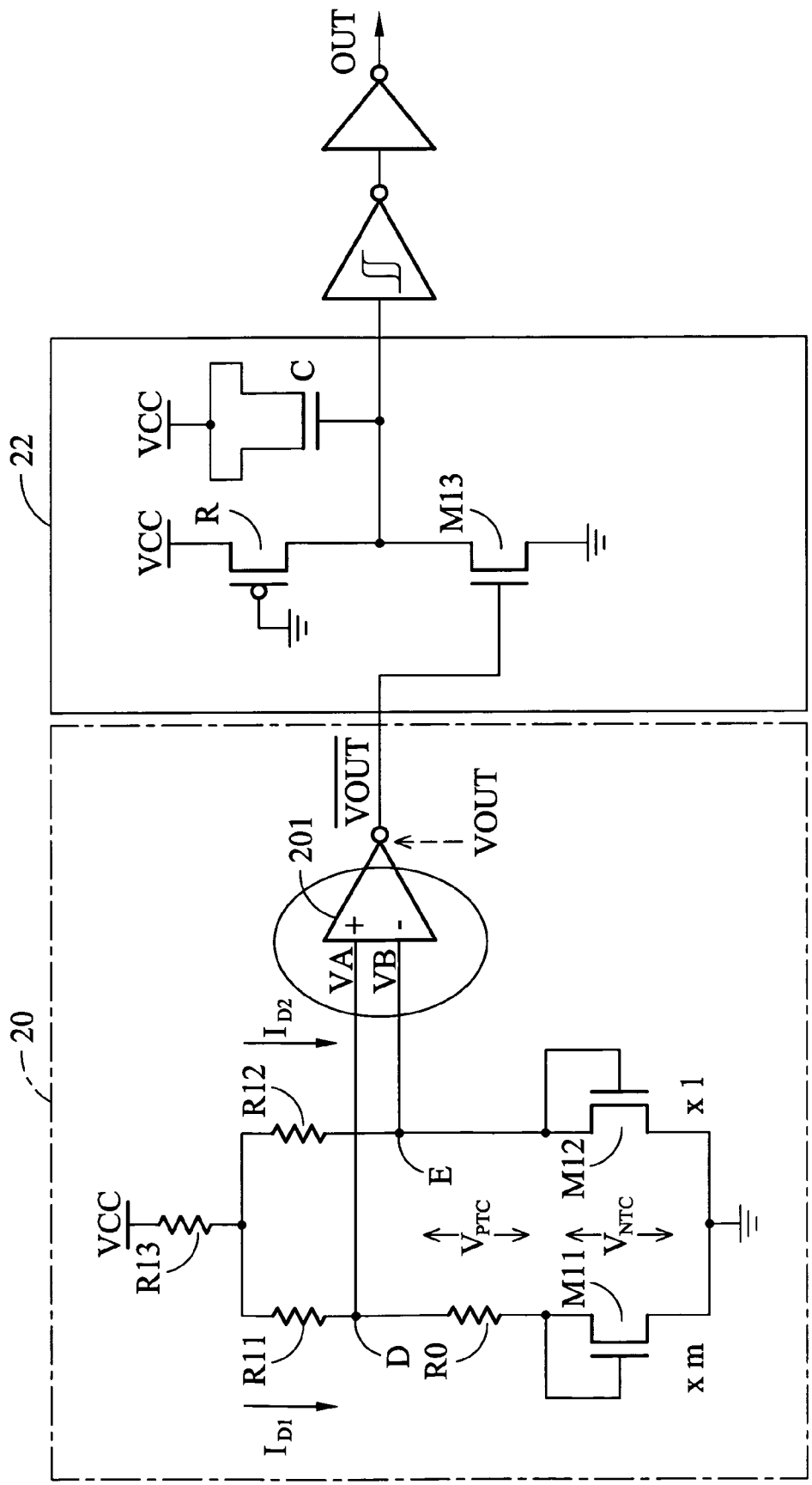
FIG. 2 shows another conventional power-on detection circuit.
Figure 3:
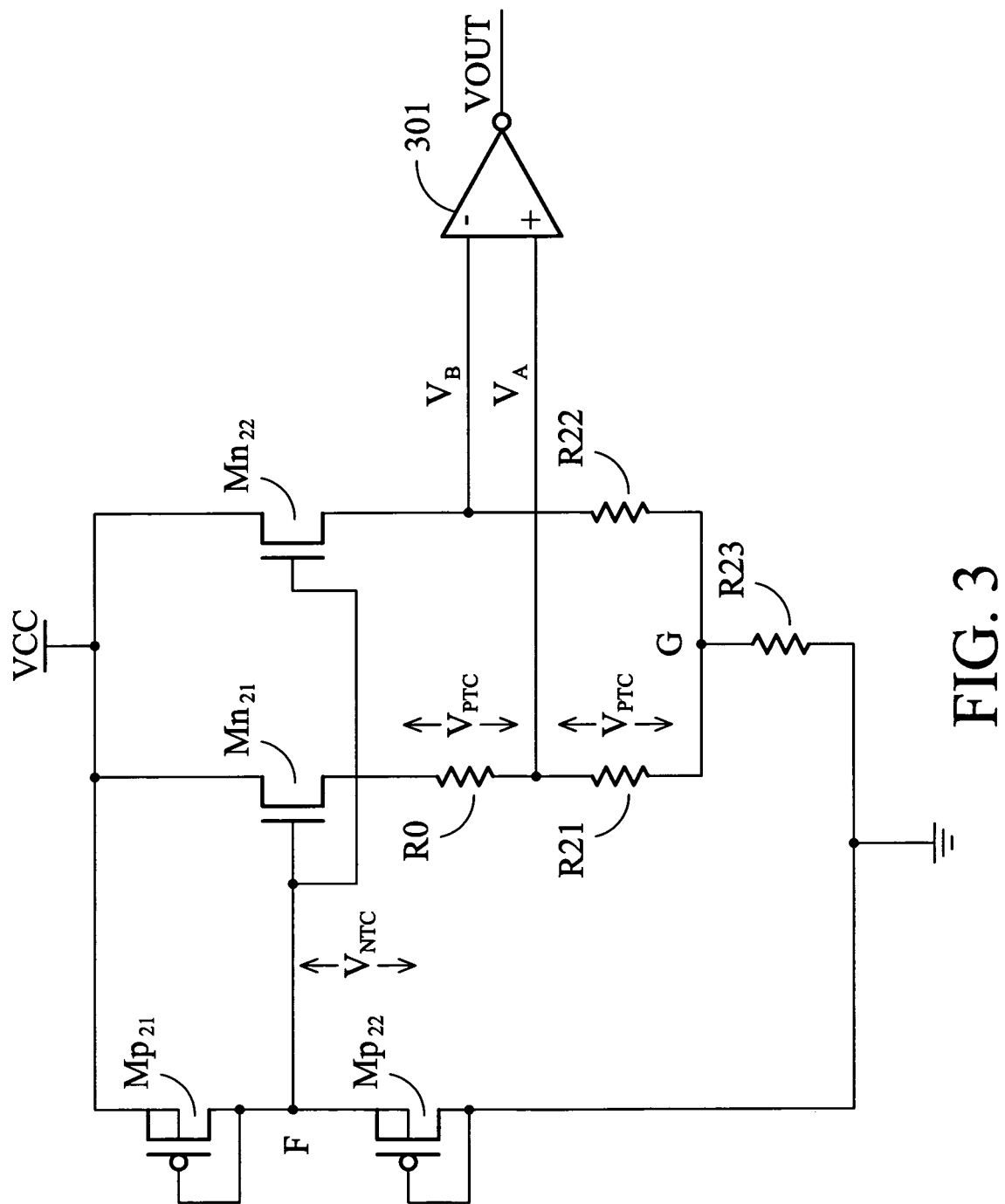
FIG. 3 shows a circuit of a voltage detection circuit according to an embodiment of the invention.

FIG. 3 shows a circuit of a voltage detection circuit according to an embodiment of the invention.

The drains of NMOS transistor Mn21 and NMOS transistor Mn22 are connected to power source VCC. The gates of NMOS transistor Mn21 and NMOS transistor Mn22 are connected at node F. Comparator 301 comprises a first input terminal, a second input terminal connected to the source of NMOS transistor Mn22, and an output terminal. The voltage level of the first input terminal of comparator 301 is VA, and that of the second input terminal of comparator 301 is VB. Resistor R0 is connected between the first input terminal of comparator 301 and the source of NMOS transistor Mn21. Resistors R21 and R22 are respectively connected between the first and second input terminal of comparator 301 and node G. Resistor R23 is connected between node G and ground. The source of PMOS transistor Mp21 is connected to power source VCC, the gate and drain of PMOS transistor Mp21 are connected to node F. The source of PMOS transistor Mp22 is connected to node F, the gate and drain of PMOS transistor Mp22 are connected to ground. Note that the voltage difference respectively across the resistors R0, R21, R22, and R23 are increased incrementally as temperature increases, and the voltage level of the gates of NMOS transistor Mn21 and Mn22 is increased as temperature decreases.

During the power-on process, the power source VCC is initially increased from 0V, before reaching a predetermined voltage level $V_{rr}$, voltage VA is lower than the voltage VB, and the output terminal VOUT of the comparator 301 is at low level. When the voltage source VCC reaches the predetermined voltage level $V_{rr}$, the voltage VA is equal to voltage VB. At this time, comparator 301 detects the voltage VA and VB, and its output terminal VOUT transitions from low level to high level. Subsequently, the voltage VA exceeds the voltage VB. Thus, the output terminal VOUT of the comparator 301 is at the high level margin.

In addition, when the voltage VA is equal to voltage VB, the voltage level $V_{rr}$ of a detection point is:

$$V_{rr} = V_{OV1} + V_{TH} + \left(\frac{\Delta V_{OV}}{R0}\right)(R21 + R0) + \left(\frac{\Delta V_{OV}}{R0}\right)\left(1 + \frac{R21}{R22}\right)R23 = \quad (7)$$

$$V_{OV1} + V_{TH} + \left(\frac{\Delta V_{OV}}{R0}\right)\left[(R21 + R0) + \left(1 + \frac{R21}{R22}\right)R23\right]$$

wherein $V_{OV1} + V_{TH}$ is $V_{GS}$ of NMOS transistor Mn21.

In addition, assuming the resistance of PMOS transistor Mp21 and Mp22 are R, and voltage level of present voltage source VCC is 1.2V, the voltage level at node F is:

$$1.2 \text{ V} \times \frac{R}{R + R} = 0.6 \text{ V} \quad (8)$$

Thus, a detection point with low voltage level is obtained.

Figure 4:
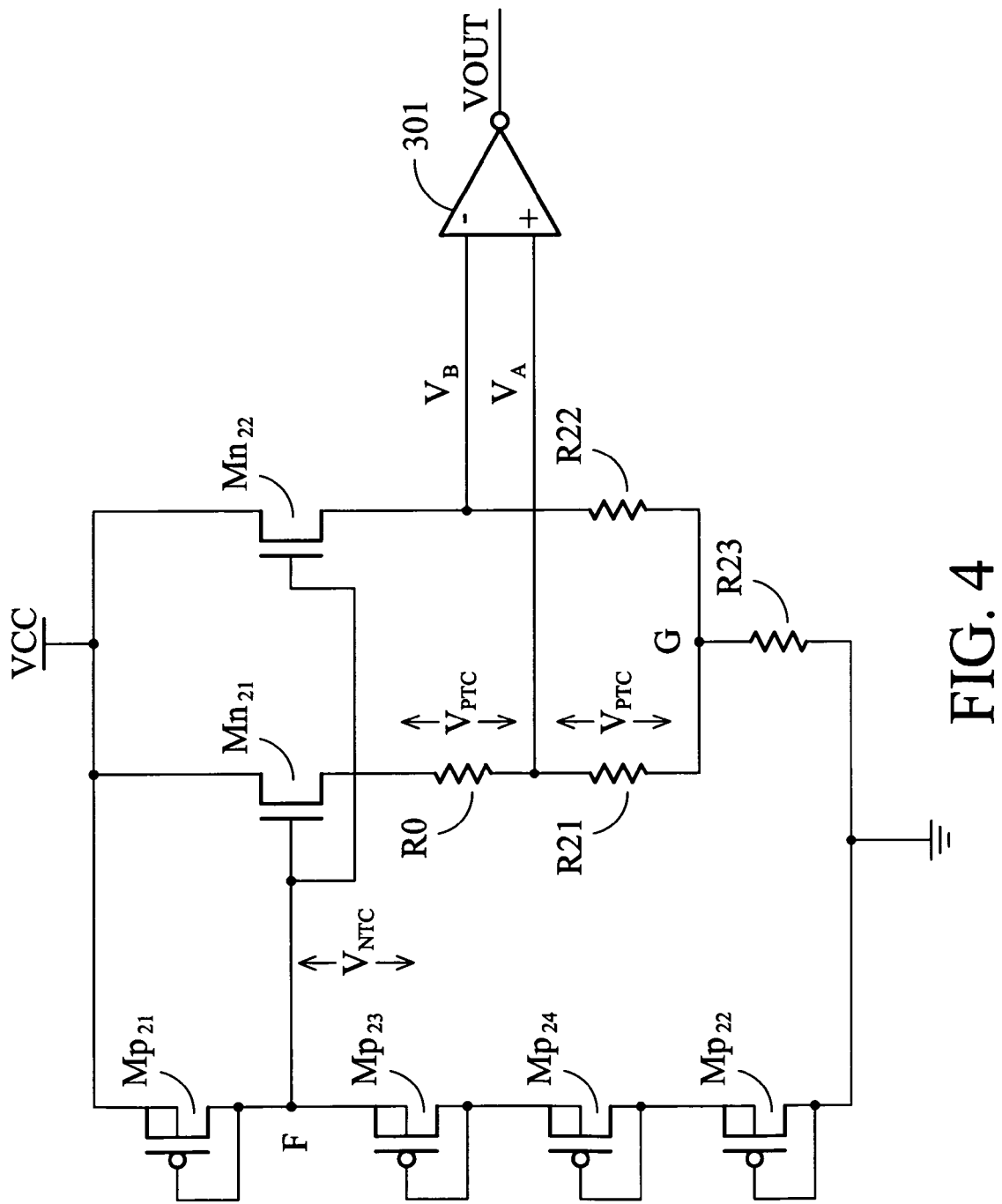
FIG. 4 shows a circuit of a voltage detection circuit according to an embodiment of the invention.

FIG. 4 shows a circuit of a voltage detection circuit according to another embodiment of the invention. Note that elements in FIG. 4 share the same reference numerals, and explanation thereof is omitted to simplify the description.

In some embodiments, additional PMOS transistors Mp23 and Mp24 are provided. Thus, voltage level of power source VCC or at node F is adjustable for different applications by adding MOS transistors between power source and ground at the current path through node F.

Figure 5:
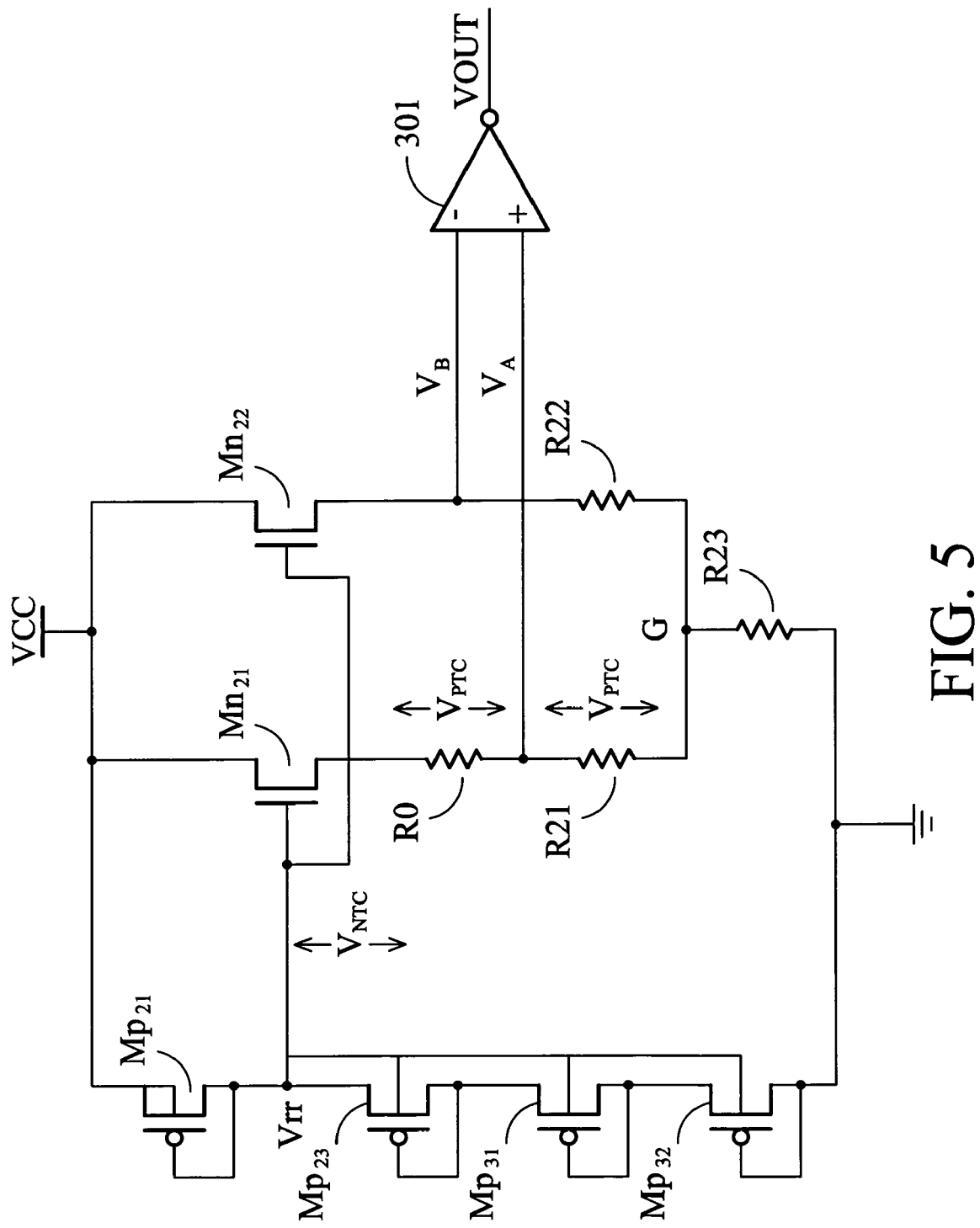
FIG. 5 shows a circuit of a voltage detection circuit according to an embodiment of the invention.

FIG. 5 shows a circuit of a voltage detection circuit according to an embodiment of the invention. Note that elements in FIG. 5 similar to elements in other figures share the same reference numerals, and explanation thereof is omitted to simplify the description.

In some embodiments, additional PMOS transistors Mp31 and Mp32 are provided. Note that each of PMOS transistors Mp31 and Mp32 has an same n-well biased at a voltage level of node F. The body effect occurs when the n-well of a PMOS transistor is biased with a voltage level different from the source of the same PMOS transistor. When the bias voltage applied to the n-well of a PMOS transistor exceeds that applied to the source of the PMOS transistor, the voltage difference across the body and source of a PMOS transistor is increased. Thus, the n-wells respectively of PMOS transistors Mp31 and Mp32 can selectively connect to the gates of NMOS transistors Mn21 and Mn22 to compensate for the voltage shift at node F caused by process variation.

Accordingly, the invention provides a low-voltage voltage detection circuit using MOS transistors. The low-voltage voltage detection circuit according to embodiments of the invention using MOS transistors operated in a subthreshold region to form resistors for voltage dividing, thus, reducing current leakage and size requirements, when compared with bipolar transistors. In addition, as MOS transistors implemented in the low-voltage voltage detection circuit, a low voltage detection point is obtained, which is unobtainable as using bipolar transistors.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A voltage detection circuit for detecting a voltage level of a power source, the voltage detection circuit comprising:
   a first NMOS transistor comprising a first gate, a first source, and a first drain coupled to the power source;
   a second NMOS transistor comprising a second gate coupled to the first gate, a second source, and a second drain coupled to the power source;
   a comparator comprising a first input terminal, a second input terminal coupled to the second source, and an output terminal;
   a first resistor coupled between the first input terminal and the first source;
   a second resistor coupled to the first input terminal and the first resistor;
   a third resistor coupled between the second resistor and the second input terminal;
   a fourth resistor coupled between a connection point of the second resistor and the third resistor, and ground;
   a first PMOS transistor comprising a third gate coupled to the first gate and the second gate, a third source coupled to the power source, and a third drain coupled to the third gate; and
   a second PMOS transistor comprising a fourth gate, a fourth source coupled to the first gate and the second gate, a fourth drain coupled to the fourth gate and ground, and a fourth n-well directly connected to the first gate and the second gate.

2. The voltage detection circuit as claimed in claim 1, further comprising a third PMOS transistor, comprising a fifth gate, a fifth source coupled to the third drain, a fifth drain coupled to the fourth source and the fifth gate, and a fifth n-well directly connected to the first gate and the second gate.

3. The voltage detection circuit as claimed in claim 1, further comprising a plurality of third PMOS transistors serially coupled between the third drain and the fourth source, each comprising a fifth gate, a fifth source coupled to the third drain, a fifth drain coupled to the fourth source and the fifth gate, and a fifth n-well directly connected to the first gate and the second gate.

4. The voltage detection circuit as claimed in claim 2, wherein voltage levels respectively of the fourth source and the fourth n-well are different.

5. The voltage detection circuit as claimed in claim 3, wherein voltage levels respectively of the fourth source and the fourth n-well are different.

6. The voltage detection circuit as claimed in claim 3, wherein voltage levels respectively of at least one fifth source and the fifth n-well are different.

7. The voltage detection circuit as claimed in claim 1, wherein the voltage differences respectively across the first resistor, the second resistor, the third resistor, and the fourth resistor are increased incrementally as temperature increases.

8. The voltage detection circuit as claimed in claim 1, wherein a voltage level of the first gate and the second gate is increased as temperature decreases.

9. A voltage detection circuit for detecting a voltage level of a power source, the voltage detection circuit comprising:
   a first NMOS transistor comprising a first gate, a first source, and a first drain coupled to the power source;
   a second NMOS transistor comprising a second gate coupled to the first gate, a second source, and a second drain coupled to the power source;
   a comparator comprising a first input terminal, a second input terminal coupled to the second source, and an output terminal;
   a first resistor coupled between the first input terminal and the first source;
   a second resistor coupled to the first input terminal and the first resistor;
   a third resistor coupled between the second resistor and the second input terminal;
   a fourth resistor coupled between a connection point of the second resistor and the third resistor, and ground;
   a first PMOS transistor comprising a third gate coupled to the first gate and the second gate, a third source coupled to the power source, and a third drain coupled to the third gate;

a second PMOS transistor comprising a fourth gate, a fourth source coupled to the first gate and the second gate, a fourth drain coupled to the fourth gate and ground, and a fourth n-well directly connected to the first gate and the second gate; and a plurality of third PMOS transistors serially coupled between the third drain and the fourth source, each comprising a fifth gate, a fifth source coupled to the third drain, a fifth drain coupled to the fourth source and the fifth gate, and a fifth n-well directly connected to the first gate and the second gate.

10. The voltage detection circuit as claimed in claim 9, wherein voltage levels respectively of the fourth source and the fourth n-well are different.

11. The voltage detection circuit as claimed in claim 9, wherein voltage levels respectively of at least one fifth source and the fifth n-well are different.

12. The voltage detection circuit as claimed in claim 9, wherein the voltage difference respectively across the first resistor, the second resistor, the third resistor, and the fourth resistor are increased incrementally as temperature increases.

13. The voltage detection circuit as claimed in claim 9, wherein a voltage level of the first gate and the second gate is increased as temperature decreases.

* * * * *